United States Patent
Basceri et al.

(10) Patent No.: US 6,905,955 B2
(45) Date of Patent: Jun. 14, 2005

(54) METHODS OF FORMING CONDUCTIVE CONNECTIONS, AND METHODS OF FORMING NANOFEATURES

(75) Inventors: Cem Basceri, Boise, ID (US); Garo J. Derderian, Boise, ID (US)

(73) Assignee: Micron Technology, Inc., Boise, ID (US)

(*) Notice: Subject to any disclaimer, the term of this patent is extended or adjusted under 35 U.S.C. 154(b) by 86 days.

(21) Appl. No.: 10/358,728

(22) Filed: Feb. 4, 2003

(65) Prior Publication Data

US 2004/0152293 A1 Aug. 5, 2004

(51) Int. Cl.$^7$ .......................................... H01L 21/4763
(52) U.S. Cl. ........................................................ 438/622
(58) Field of Search ............................................. 438/622

(56) References Cited

U.S. PATENT DOCUMENTS 4,001,050 A * 1/1977 Koo ............................ 257/544
6,753,250 B1 * 6/2004 Hill et al. .................... 438/637

OTHER PUBLICATIONS

Park et al., "Block Copoloymer Lithography: Periodic Arrays of—10" Holes in 1 Square Centimeter", Science, vol. 276, May 30, 1997, pp. 1401–1404.

* cited by examiner

Primary Examiner—David S. Blum
(74) Attorney, Agent, or Firm—Wells St. John P.S.

(57) ABSTRACT

The invention includes a method of forming a plurality of nanostructures associated with a semiconductor substrate. A semiconductor substrate is exposed to a molecule which self-assembles into ordered domains on the substrate to form a layer over the substrate. A component of the molecule is removed from the layer to form openings extending into the layer. A conductive material is formed within the openings.

65 Claims, 5 Drawing Sheets

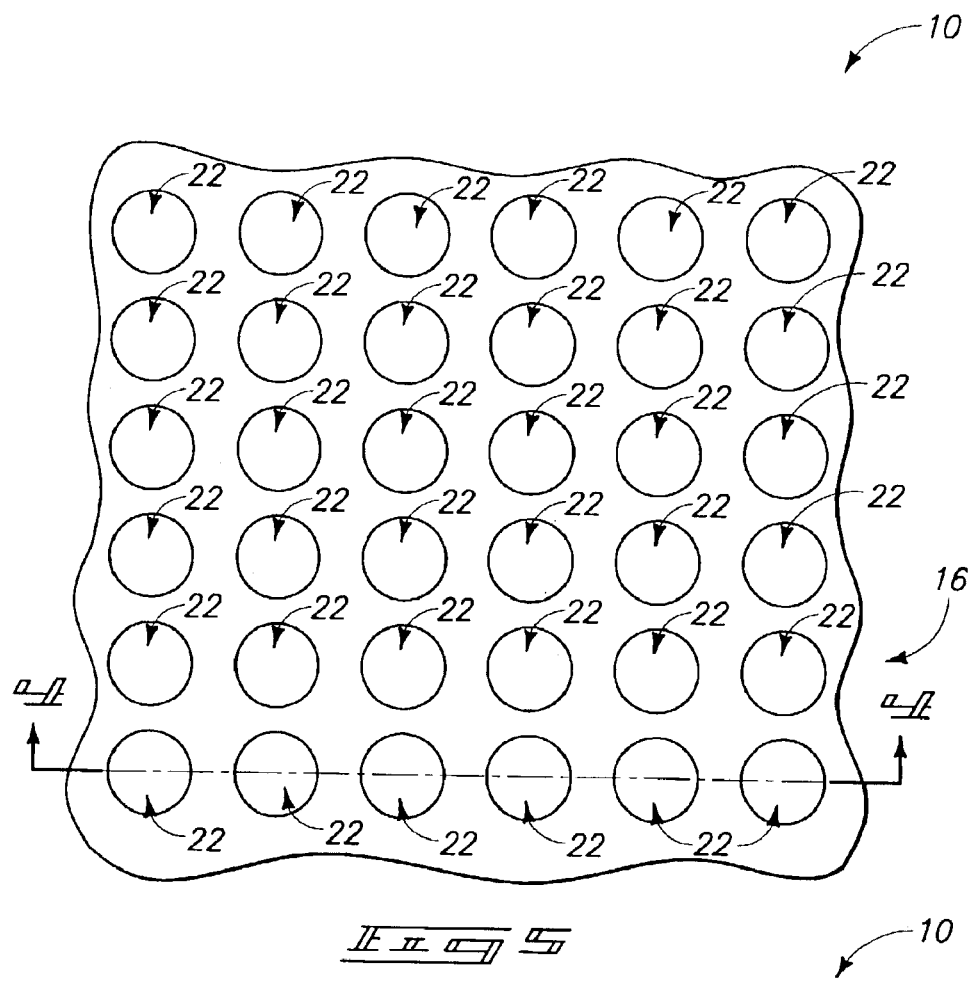
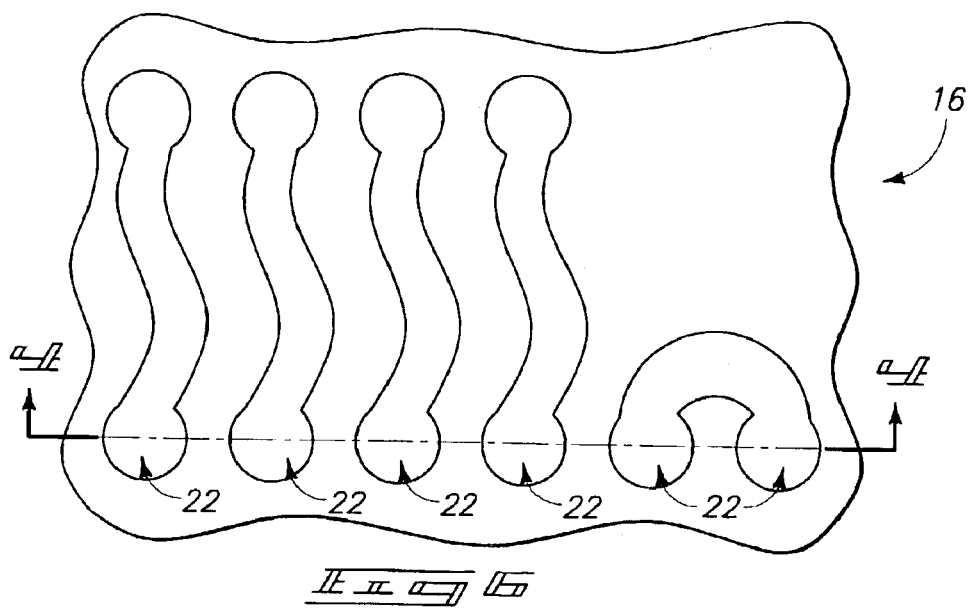

METHODS OF FORMING CONDUCTIVE CONNECTIONS, AND METHODS OF FORMING NANOFEATURES

TECHNICAL FIELD

The invention pertains to methods of forming conductive connections, such as methods of forming connections to electrical nodes associated with semiconductor substrates. In particular aspects, the invention pertains to methods of forming connections to nanodevices. The invention also includes methods of forming nanofeatures, such as, for example, quantum dots.

BACKGROUND OF THE INVENTION

Nanodevices are structures having dimensions measured in nanometers. Nanotechnology is a field associated with formation of nanodevices, and is a growing field expected to make significant impacts in diverse subject areas, including, for example, biology, chemistry, computer science and electronics.

Nanodevices include, for example, quantum dots and nanowires. A quantum dot is a particle of matter in which addition or removal of an electron changes its properties in some useful way. A nanowire is a thin filament having a width less than or equal to about 200 angstroms, and frequently less than or equal to about 50 angstroms.

Quantum dots and nanowires can have numerous applications. For instance, quantum dots and nanowires can significantly increase the density of electronic devices, which can increase performance of the devices. Quantum dots may be particularly useful in high-density memory and storage media. Specifically, a quantum dot can be incorporated into data storage devices. If the position of an electron within a quantum dot changes a state of the dot, the quantum dot can represent a byte of data.

Although various techniques have been developed for forming nanodevices, there remains a need to develop methodologies which can enable large-scale fabrication of the devices. Accordingly, it is desirable to develop new techniques for fabrication of nanodevices.

SUMMARY OF THE INVENTION

In one aspect, the invention encompasses a method of forming a plurality of electrically conductive nanofeatures within a layer. A substrate is exposed to a molecule which self-assembles into ordered domains on the substrate to form a layer over the substrate. Openings are formed through the layer. A conductive material is formed over the layer and within the openings. The conductive material is removed from over the layer, but left within the openings to form nanofeatures. The substrate can comprise an electrically insulative material, and can surround all of the nanofeatures except the top. In subsequent processing, an electrically insulative material can be formed over the top of the nanofeatures to electrically isolate the nanofeatures. The isolated nanofeatures can correspond to, for example, quantum dots.

In one aspect, the invention encompasses a method of forming a plurality of conductive connections to electrical nodes associated with a semiconductor substrate. A semiconductor substrate is exposed to a molecule which self-assembles into ordered domains on the substrate to form a layer over the substrate. A component of the molecule is removed from the layer to form openings extending into the layer. The openings are over node locations associated with the semiconductor substrate. A conductive material is formed over the layer and within the openings. The conductive material extends to the node locations.

In another aspect, a semiconductor substrate is provided, and a silicon nitride layer is formed over the substrate. The silicon nitride layer is exposed to a copolymer comprising polystyrene covalently bonded to a second component of the copolymer. The copolymer forms a mass over the silicon nitride layer. A component of the copolymer is removed from the mass to form openings in the mass. The openings are extended through the silicon nitride layer and to the semiconductor substrate. A conductive material is formed within the openings.

BRIEF DESCRIPTION OF THE DRAWINGS

Preferred embodiments of the invention are described below with reference to the following accompanying drawings.

FIG. 5 is a top view of the FIG. 4 fragment illustrating an exemplary aspect of the invention.

FIG. 6 is a top view of the FIG. 4 fragment illustrating an exemplary aspect of the invention alternative to that shown in FIG. 5.

DETAILED DESCRIPTION OF THE PREFERRED EMBODIMENTS

Figure 1:
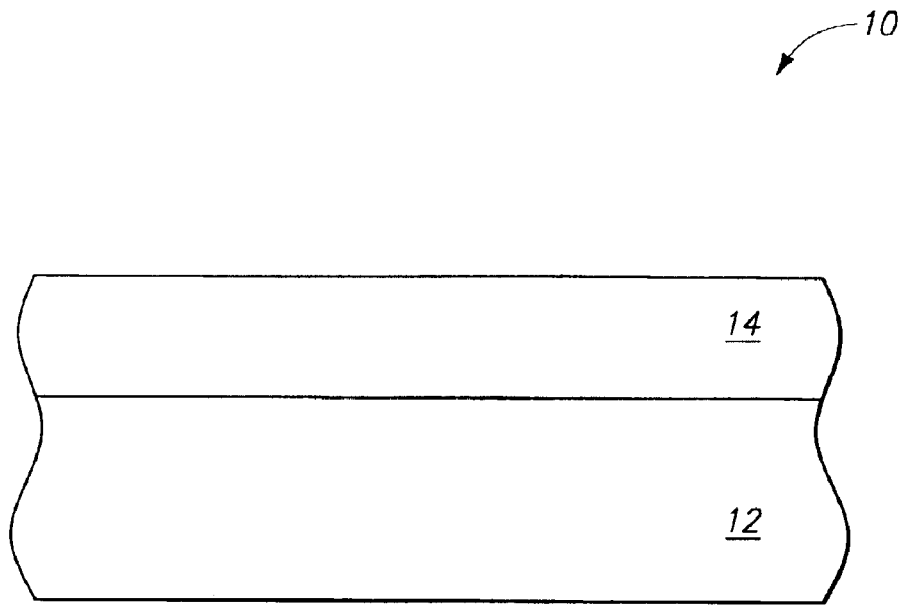
FIG. 1 is a diagrammatic, cross-sectional view of a fragment at a preliminary processing stage of an exemplary aspect of the invention.

FIG. 1 shows a fragment of a construction 10 at a preliminary processing stage of an exemplary aspect of the present invention. Construction 10 comprises a substrate 12 having a layer 14 thereover. Substrate 12 can comprise, consist essentially of, or consist of an appropriately doped semiconductor material, such as, for example, background p-type doped monocrystalline silicon. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. In particular aspects, substrate 12 can be a monocrystalline silicon wafer, and the shown fragment of construction 10 can thus correspond to a semiconductor wafer fragment.

Layer 14 can comprise an electrically insulative material, and in particular aspects can comprise, consist essentially of, or consist of silicon nitride. Layer 14 can be referred to as a first layer in the discussion that follows. Layer 14 can be formed physically against substrate 12 (as shown), or can be separated from substrate 12 by one or more intervening materials (not shown).

Figure 2:
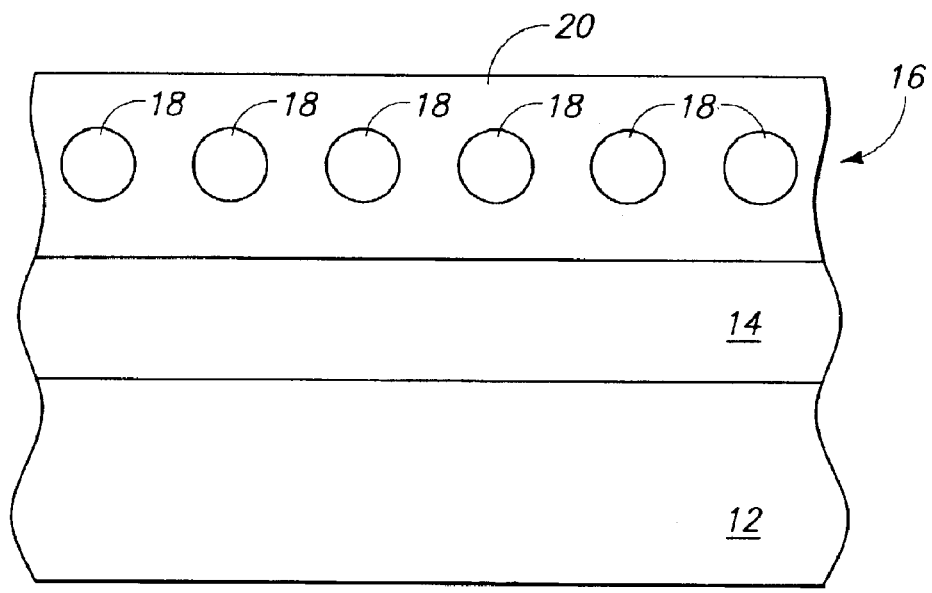
FIG. 2 is a view of the FIG. 1 fragment shown at a processing stage subsequent to that of FIG. 1.

Referring to FIG. 2, layer 14 is exposed to a molecule which self-assembles into ordered domains over layer 14. The self-assembled molecule forms a second layer 16 over layer 14. The second layer 16 can be physically against first layer 14 (as shown). The molecule utilized to form layer 16 can comprise, for example, a diblock copolymer of the type described in Park et al., (Park M., et al. "Block Copolymer Lithography: Periodic Arrays of ~$10^{11}$ Holes in 1 Square Centimeter" SCIENCE vol. 276 (30 May 1997) pp. 1401–1404). Such copolymer can consist of two chemically different polymer chains joined by a covalent bond. Particular copolymers include polystyrene-polybutadiene and polystyrene-polyisoprene.

Layer 16 is exposed to conditions which selectively remove one of the components of the copolymer molecule, while leaving the other of the components within the layer. Such forms altered regions 18 within layer 16, while leaving a matrix 20 around the altered regions. If the copolymer utilized to form layer 16 comprises one or both of the exemplary copolymers polystyrene-polybutadiene and polystyrene-polyisoprene, regions 18 can correspond to locations where polybutadiene and/or polyisoprene has been removed. Accordingly, matrix 20 can correspond to the polystyrene portion of the exemplary copolymers. Selective removal of polybutadiene relative to polystyrene can occur by exposing layer 16 to ozone.

Figure 3:
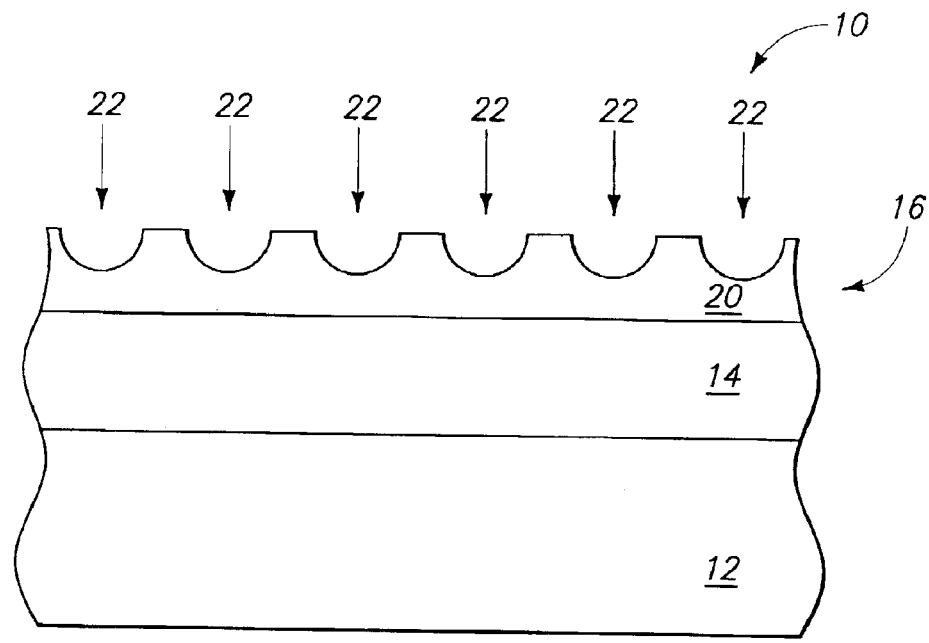
FIG. 3 is a view of the FIG. 1 fragment shown at a processing stage subsequent to that of FIG. 2.

Referring to FIG. 3, openings 22 are extended through altered regions 18 of layer 16. Openings 22 can be formed by exposing layer 16 to reactive ion etching conditions.

Figure 4:
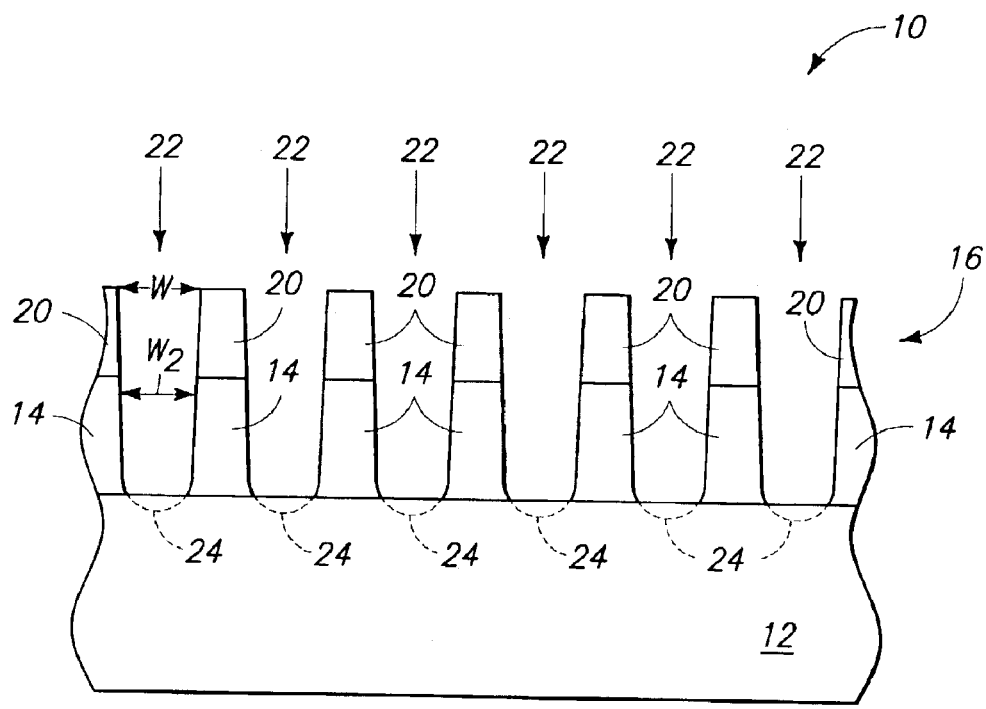
FIG. 4 is a view of the FIG. 1 fragment shown at a processing stage subsequent to that of FIG. 3.

Referring to FIG. 4, openings 22 are extended through layers 16 and 14, and to substrate 12. Although the openings are shown terminating at an upper surface of substrate 12, it is to be understood that in other aspects (not shown) the openings can penetrate into substrate 12, or can extend into layer 14 but not to substrate 12. Also, in some aspects (not shown), materials 12 and 14 can be a single material, rather than the shown pair of materials. In such aspects the openings can be considered to extend into a substrate comprising the single material.

Openings 22 can be extended utilizing a suitable etch, such as, for example, a reactive ion etch. Node locations 24 can be defined at bottom peripheries of the openings. In applications in which substrate 12 comprises semiconductive material (such as, for example, monocrystalline silicon) electrical nodes can be formed at locations 24 subsequent to formation of openings 22 by, for example, implanting a suitable conductivity-enhancing dopant into node locations 24. The conductivity-enhancing dopant implanted into locations 24 can be either p-type or n-type, or can comprise both p-type and n-type in particular applications. Alternatively, electrical nodes can be formed at locations 24 in processing either prior to formation of openings 22, or after formation of various materials within openings 22. In yet other alternative embodiments, the electrical nodes can be omitted. In particular aspects of such embodiments, substrate 12 can comprise an electrically insulative material.

Openings 22 comprise a depth from an upper surface of layer 16 to a bottom of the openings, and comprise a maximum width dimension extending orthogonally to the depth. The shown openings have a maximum width dimension "W" at uppermost regions of the openings. However, another maximum width dimension "$W_2$" can be defined as a maximum width at or below an uppermost surface of layer 14. In particular aspects, maximum width "W" is less than or equal to about 200 angstroms, less than or equal to about 100 angstroms, or less than or equal to about 50 angstroms, and in exemplary aspects can be from about 5 angstroms to less than or equal to about 100 angstroms. In other aspects of the invention, maximum width "$W_2$" can be less than or equal to about 200 angstroms, less than or equal to about 100 angstroms, less than or equal to about 50 angstroms, or from about 5 angstroms to less than or equal to about 100 angstroms. In yet further aspects of the invention, a dimension of the openings can be defined as a width dimension along bottom surfaces of the openings. The openings can have a maximum width dimension along the bottom surfaces that is less than or equal to about 200 angstroms, less than or equal to about 100 angstroms, or less than or equal to about 50 angstroms, and in exemplary aspects from about 5 angstroms to less than or equal to about 100 angstroms.

Openings 22 can be utilized in forming any of numerous nanodevices, including, for example, quantum dots and nanowires. The particular type of nanodevice can, in particular applications, be defined by the type of copolymer utilized in forming layer 16. For instance, FIG. 5 illustrates a top view of the fragment 10 comprising openings 22 in an embodiment in which openings 22 are substantially circular in shape, and accordingly can be utilized to form dots of conductivity-enhancing dopant when the dopant is implanted through the openings and into a semiconductive material substrate 12. The dots can be quantum dots if the openings are formed to a suitably small cross-sectional width dimension. FIG. 6 illustrates a top view of fragment 10 in an aspect in which openings 22 are formed to filamentous. Exemplary copolymers which lead to filamentous openings of the type described in FIG. 6 are discussed in the article by Park et al; and exemplary copolymers which lead to circular openings of the type described in FIG. 5 are also discussed in the article by Park et al.

The filamentous openings of FIG. 6 can be utilized for forming nanowires. The nanowires can be formed from dopant implanted through the openings and into a semiconductive substrate, and/or the nanowires can be formed of conductive materials formed in the filamentous openings of FIG. 6. If the nanowires are formed of conductive materials deposited in the openings, the nanowires can be considered to be "cast" in the openings. Accordingly, methodology of the present invention can, in particular aspects, be considered nanowire casting methodology.

Figure 7:
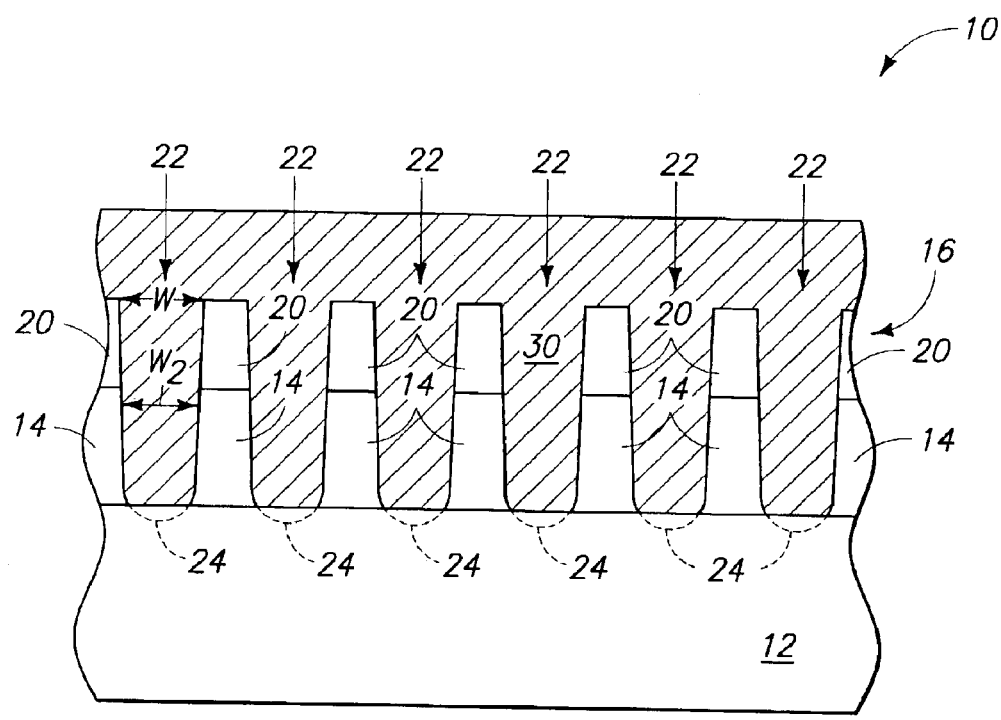
FIG. 7 is a view of the FIG. 1 fragment at a processing stage subsequent to that of FIG. 4.

Referring to FIG. 7, fragment 10 is shown in the cross-sectional view of FIG. 4 at an exemplary processing stage subsequent to that of FIG. 4. Specifically, a conductive material 30 is formed over layer 16 and within openings 22. Conductive material 30 can comprise, for example, metal and/or conductively-doped semiconductive material. In particular aspects, material 30 can comprise, consist essentially of, or consist of tungsten. In other aspects, material 30 can comprise, consist essentially of, or consist of conductively-doped silicon. The doped silicon can be either p-type or n-type doped.

If material 30 comprises conductively-doped silicon, electrical nodes can be formed at node locations 24 by out-diffusion of dopant from material 30. If electrical nodes are formed at locations 24 by out-diffusion of dopant from material 30, an entirety of the conductivity-enhancing dopant of layers 24 can come from such out-diffusion. In other aspects, only a portion of the conductivity-enhancing dopant can come from such out-diffusion, and other portions of the conductivity-enhancing dopant can be provided by either an implant at the processing of FIG. 4 or by other suitable methods.

Conductive material 30 can be formed by any suitable method, including, for example, one or more of atomic layer deposition, chemical vapor deposition and physical vapor deposition.

Figure 8:
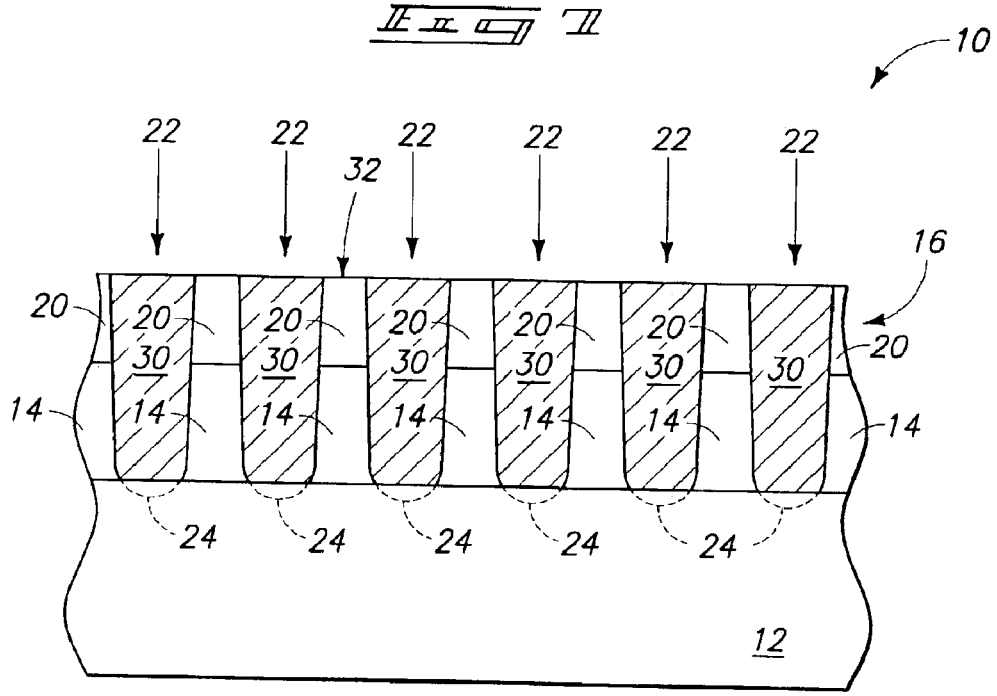
FIG. 8 is a view of the FIG. 1 fragment shown at a processing stage subsequent to that of FIG. 7.

Referring to FIG. 8, conductive material 30 is removed from over layer 16, while remaining within openings 22. Such removal can be accomplished by a planarization method, such as, for example, chemical-mechanical polishing, to form a planarized upper surface 32 extending across material 30 and layer 16. It is to be understood that the planarization can extend partially into layer 16 so that an uppermost elevational surface of layer 16 at the processing stage of FIG. 8 is below the level of an uppermost surface of layer 16 at the processing stage of FIG. 7.

Figure 9:
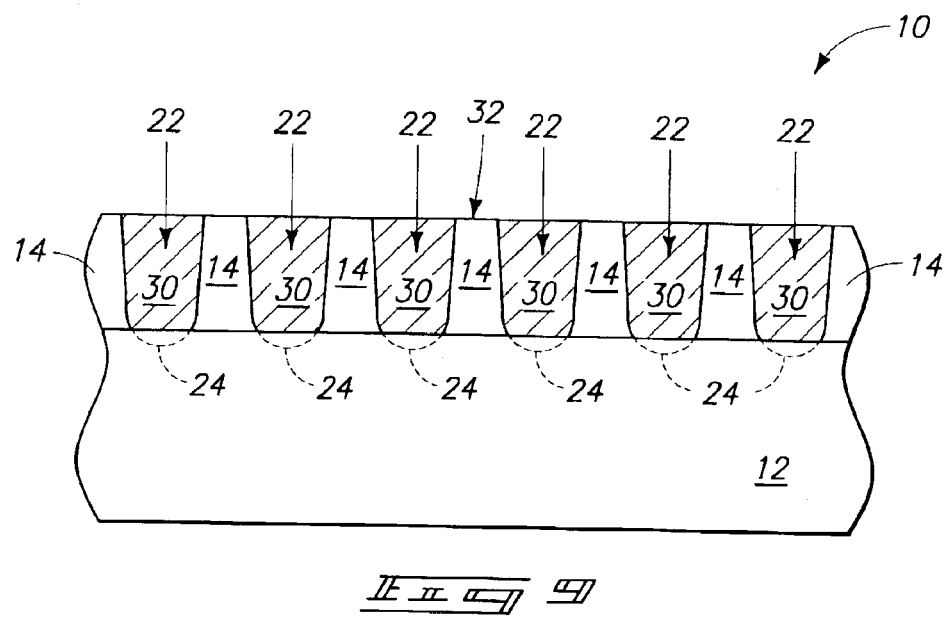
FIG. 9 is a view of the FIG. 1 fragment shown at a processing stage subsequent to that of FIG. 8.

Referring to FIG. 9, the planarization of an uppermost surface of construction 10 can be extended to reduce an elevational level of surface 32 to layer 14. Accordingly, the planarization can remove layer 16. The elevational level of surface 32 at the processing stage of FIG. 9 can be at or below an uppermost surface of layer 14 at the processing stage of FIG. 8. Conductive material 30 within openings 22 at the processing stage of FIG. 9 has a maximum width at or below the width "$W_2$" described above with reference to FIG. 4. Conductive materials 30 extend to node locations 24, and accordingly can be utilized as a conductive interconnect between various circuit constructions (not shown) and node locations 24. In particular aspects, the conductive interconnects formed within openings 22 can be considered to be ordered electrodes extending to diffusion regions associated with substrate 12. In such aspects, the term "ordered" can refer to the structured patterning of the electrodes accomplished utilizing the ordered domains of the self-assembling copolymer.

An advantage of the processing described with reference to FIGS. 1–9, relative to traditional semiconductor processing, is that conductive interconnects can be formed aligned with nanostructures on a semiconductor substrate without utilization of photolithographic patterning processes. In applications in which the nanostructures are electrical nodes formed by implanting or out-diffusion of dopant through openings 22 (FIG. 4), and in which the conductive interconnects are formed within the same openings 22, the conductive interconnects can be considered to be self-aligned relative to the nanostructures.

In aspects in which electrical nodes 24 are omitted, the material 30 within openings 22 can form individual quantum dots which are not electrically connected with underlying electrical nodes. In such applications, an electrically insulative material (not shown) can be formed over surface 32 to electrically isolate the quantum dots from conductive materials (not shown) formed over the quantum dots. The methodology of the present invention can also be utilized to from electrically isolated nanostructures other than quantum dots, depending on the type of copolymer utilized at preliminary processing stages.

It is noted that if diffusion regions 24 are to be utilized as nanostructures (such as, for example, quantum dots or nanowires) the processing of FIG. 4 can be followed by alternative processing relative to that described with reference to FIGS. 7–9. For instance, the processing of FIGS. 7–9 could be omitted, and instead the diffusion regions can be covered with a suitable material, including, for example, an electrically insulative material.

Figure 10:
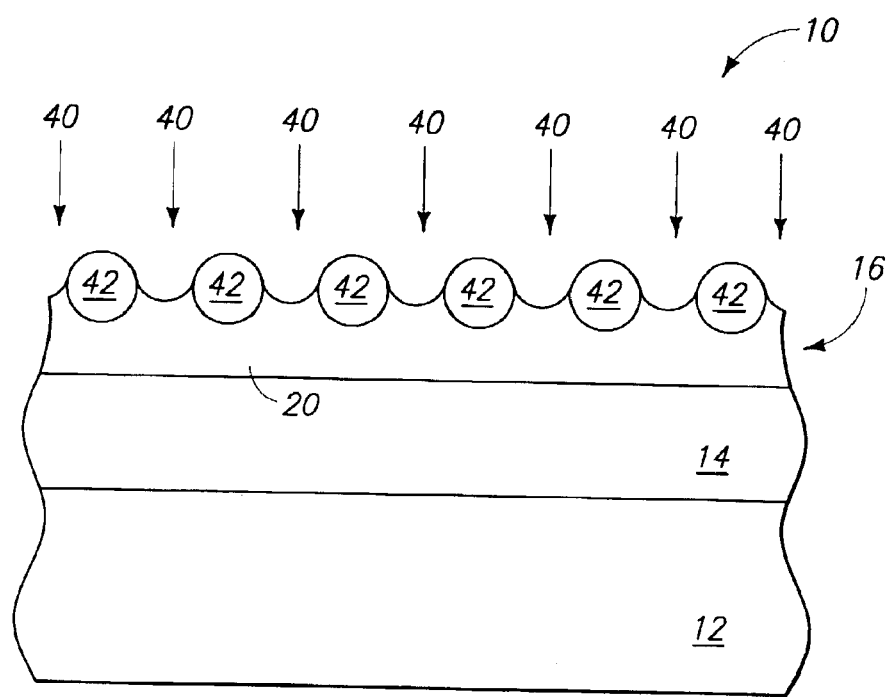
FIG. 10 is a view of the FIG. 1 fragment shown at a processing stage subsequent to that of FIG. 2, in accordance with an alternative aspect of the invention relative to that described with reference to FIG. 3.

FIGS. 2 and 3 illustrate an aspect of the invention in which openings are formed in layer 16 by, for example, removing polybutadiene from a layer comprising copolymers of polybutadiene and polystyrene. It is to be understood that the polystyrene component of such copolymers can be removed in alternative embodiments. FIG. 10 illustrates an aspect of the invention in which the butadiene component of the polymer is hardened relative to the polystyrene component, and utilized as a mask for forming openings 40 relative to layer 16. The hardened butadiene component is illustrated as circles 42. Exemplary methodology for hardening a butadiene component is described in Park et al. as an osmium stain.

The construction of FIG. 10 can be treated with methodology similar to that described with reference to FIGS. 3, 4 and 7–9 to form conductive interconnects extending to substrate 12, or to form electrically isolated nanostructures, such as quantum dots.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a plurality of electrically conductive nanostructures, comprising:
   exposing a substrate to a molecule which self-assembles into ordered domains on the substrate; the ordered domains forming a layer over the substrate;
   removing a component of the molecule from the layer in forming openings extending into the layer;
   forming a conductive material over the layer and within the openings to fill the openings; and
   removing the conductive material from over the layer while leaving the conductive material within the openings, the conductive material within the openings being in the form of nanostructures.

2. The method of claim 1 wherein the nanostructures are quantum dots.

3. The method of claim 1 wherein the substrate comprises diffusion regions formed therein, and wherein the conductive material remaining within the openings after removing the conductive material from over the layer forms ordered electrodes to the diffusion regions.

4. The method of claim 1 wherein the substrate comprises monocrystalline silicon.

5. The method of claim 1 wherein the substrate comprises silicon nitride over monocrystalline silicon; and wherein the silicon nitride is exposed to the molecule.

6. The method of claim 1 wherein the molecule consists of two different polymer chains joined by a covalent bond.

7. The method of claim 1 wherein the forming the conductive material comprises one or more of atomic layer deposition, chemical vapor deposition and physical vapor deposition.

8. The method of claim 1 wherein the conductive material comprises a metal.

9. The method of claim 1 wherein the conductive material comprises conductively-doped semiconductive material.

10. The method of claim 1 wherein the removing the conductive material comprises chemical-mechanical polishing.

11. A method of forming a plurality of conductive connections to electrical nodes associated with a semiconductor substrate, comprising:
providing a semiconductor substrate;
exposing the substrate to a molecule which self-assembles into ordered domains on the semiconductor substrate; the ordered domains forming a layer over the substrate;
removing a component of the molecule from the layer, regions of the layer where the component is removed being altered relative to other regions of the layer;
utilizing the altered regions in forming openings extending through the layer; the openings being over node locations associated with the semiconductor substrate; and
forming a conductive material over the layer and within the openings to fill the openings, the conductive material extending to the node locations.

12. The method of claim 11 wherein the conductive material within the openings is in the shape of nanowires.

13. The method of claim 11 wherein the electrical nodes are formed at the node locations by implanting conductive-enhancing dopant through the openings and into the node locations.

14. The method of claim 11 wherein the electrical nodes are quantum dots.

15. The method of claim 11 wherein the molecule consists of two different polymer chains joined by a covalent bond.

16. The method of claim 11 wherein the openings have a depth and a maximum width dimension extending orthogonally to the depth, and wherein the maximum width dimension is less than or equal to about 200 Angstroms.

17. The method of claim 11 wherein the openings have a depth and a maximum width dimension extending orthogonally to the depth, and wherein the maximum width dimension is less than or equal to about 100 Angstroms.

18. The method of claim 11 wherein the openings have a depth and a maximum width dimension extending orthogonally to the depth, and wherein the maximum width dimension Is less than or equal to about 50 Angstroms.

19. The method of claim 11 wherein the openings have a depth and a maximum width dimension extending orthogonally to the depth, and wherein the maximum width dimension is from about 5 Angstroms to less than or equal to about 100 Angstroms.

20. The method of claim 11 wherein the forming the conductive material comprises one or more of atomic layer deposition, chemical vapor deposition and physical vapor deposition.

21. The method of claim 11 wherein the conductive material comprises a metal.

22. The method of claim 11 wherein the conductive material comprises conductively-doped semiconductive material.

23. The method of claim 22 wherein the electrical nodes comprise conductively-doped diffusion regions formed at the node locations, and further comprising forming at least a portion of the conductively-doped diffusion regions by out-diffusing dopant from the conductively-doped semiconductive material.

24. The method of claim 23 wherein the electrical nodes are dots.

25. The method of claim 22 wherein the semiconductive material comprises silicon.

26. The method of claim 11 further comprising removing the conductive material from over the layer.

27. The method of claim 26 wherein the removing comprises chemical-mechanical polishing.

28. The method of claim 11 wherein the altered regions comprise openings penetrating only partially through the layer, and wherein the utilizing the altered regions comprises exposing the layer to an etch to extend the openings entirely through the layer and to the node locations.

29. The method of claim 28 wherein the etch is a reactive ion etch.

30. A method of forming a plurality of conductive connections to electrical nodes associated with a semiconductor substrate, comprising:
providing a semiconductor substrate;
forming a first layer over the semiconductor substrate, the first layer comprising silicon nitride;
exposing the first layer to a copolymer which self-assembles into ordered domains on the first layer; the ordered domains forming a second layer over the first layer;
removing a component of the copolymer to form openings in the second layer;
extending the openings through the first layer and to the semiconductor substrate; the openings extending to node locations associated with the semiconductor substrate; and
forming a conductive material over the second layer and within the openings to fill the openings, the conductive material extending to the node locations.

31. The method of claim 30 wherein the electrical nodes are formed at the node locations by implanting conductive-enhancing dopant through the extended openings and into the node locations.

32. The method of claim 30 wherein the forming the conductive material comprises one or more of atomic layer deposition, chemical vapor deposition and physical vapor deposition.

33. The method of claim 30 wherein the electrical nodes are dots.

34. The method of claim 30 wherein the conductive material comprises a metal.

35. The method of claim 30 wherein the conductive material comprises tungsten.

36. The method of claim 30 wherein the conductive material comprises conductively-doped semiconductive material.

37. The method of claim 36 wherein the electrical nodes comprise conductively-doped diffusion regions formed at the node locations, and further comprising forming at least a portion of the conductively-doped diffusion regions by out-diffusing dopant from the conductively-doped semiconductive material.

38. The method of claim 36 wherein the semiconductive material comprises silicon.

39. The method of claim 30 further comprising removing the conductive material from over the second layer.

40. The method of claim 39 wherein the removing comprises chemical-mechanical polishing.

41. The method of claim 30 further comprising removing the conductive material and second layer from over the first layer to leave the conductive material remaining within the openings in the first layer as conductive material interconnects.

42. The method of claim 41 wherein the conductive material interconnects have a depth and a maximum width dimension extending orthogonally to the depth, and wherein the maximum width dimension is less than or equal to about 200 Angstroms.

43. The method of claim 41 wherein the conductive material interconnects have a depth and a maximum width dimension extending orthogonally to the depth, and wherein the maximum width dimension is less than or equal to about 100 Angstroms.

44. The method of claim 41 wherein the conductive material interconnects have a depth and a maximum width dimension extending orthogonally to the depth, and wherein the maximum width dimension is less than or equal to about 50 Angstroms.

45. The method of claim 41 wherein the conductive material interconnects have a depth and a maximum width dimension extending orthogonally to the depth, and wherein the maximum width dimension is from about 5 Angstroms to less than or equal to about 100 Angstroms.

46. The method of claim 30 wherein the extending the openings comprises a reactive ion etch.

47. A method of forming a plurality of conductive connections to electrical nodes associated with a semiconductor substrate, comprising:

providing a semiconductor substrate;

forming a first layer over the semiconductor substrate, the first layer comprising silicon nitride;

exposing the first layer to a copolymer comprising polystyrene covalently bonded to a second component of the copolymer; the copolymer forming a second layer over the first layer;

removing one of the polystyrene and the second component of the copolymer while leaving the other of the polystyrene and the second component within the second layer to form openings in the second layer;

extending the openings through the first layer and to the semiconductor substrate; the openings extending to node locations associated with the semiconductor substrate; and forming a conductive material over the second layer and within the openings to till the openings, the conductive material extending to the node locations.

48. The method of claim 47 wherein the removing removes the polystyrene and leaves the second component of the copolymer.

49. The method of claim 47 wherein the removing removes the second component and leaves the polystyrene of the copolymer.

50. The method of claim 47 wherein the electrical nodes are formed at the node locations by implanting conductive-enhancing dopant through the extended openings and into the node locations.

51. The method of claim 47 wherein the second component of the copolymer comprises polybutadiene.

52. The method of claim 47 wherein the second component of the copolymer comprises polyisoprene.

53. The method of claim 47 wherein the openings have bottoms and a maximum width dimension of the bottoms is less than or equal to about 200 Angstroms.

54. The method of claim 47 wherein the openings have bottoms and a maximum width dimension of the bottoms is less than or equal to about 100 Angstroms.

55. The method of claim 47 wherein the openings have bottoms and a maximum width dimension of the bottoms is less than or equal to about 50 Angstroms.

56. The method of claim 47 wherein the openings have bottoms and a maximum width dimension of the bottoms is from about 5 Angstroms to less than or equal to about 100 Angstroms.

57. The method of claim 47 wherein the forming the conductive material comprises one or more of atomic layer deposition, chemical vapor deposition and physical vapor deposition.

58. The method of claim 47 wherein the electrical nodes are dots.

59. The method of claim 47 wherein the conductive material comprises a metal.

60. The method of claim 47 wherein the conductive material comprises conductively-doped semiconductive material.

61. The method of claim 60 wherein the electrical nodes comprise conductively-doped diffusion regions formed at the node locations, and further comprising forming at least a portion of the conductively-doped diffusion regions by out-diffusing dopant from the conductively-doped semiconductive material.

62. The method of claim 60 wherein the semiconductive material comprises silicon.

63. The method of claim 47 further comprising removing the conductive material from over the second layer.

64. The method of claim 47 further comprising removing the conductive material and second layer from over the first layer.

65. The method of claim 47 wherein the extending the openings comprises a reactive ion etch.

* * * * *

UNITED STATES PATENT AND TRADEMARK OFFICE
CERTIFICATE OF CORRECTION

PATENT NO. : 6,905,955 B2
DATED : June 14, 2005
INVENTOR(S) : Cem Basceri et al.

It is certified that error appears in the above-identified patent and that said Letters Patent is hereby corrected as shown below:

Column 7,
Line 42, replace "Is less than or equal to about 50 Angstroms." with
-- is less than or equal to about 50 Angstroms. --.

Column 9,
Line 40, replace "within the openings to till the openings, the conductive" with
-- within the openings to fill the openings, the conductive --.

Signed and Sealed this

Twenty-first Day of February, 2006

JON W. DUDAS
*Director of the United States Patent and Trademark Office*